(12) United States Patent
Jeon

(10) Patent No.: US 6,760,806 B2
(45) Date of Patent: Jul. 6, 2004

(54) LOW POWER SEMICONDUCTOR MEMORY DEVICE HAVING A NORMAL MODE AND A PARTIAL ARRAY SELF REFRESH MODE

(75) Inventor: Byung Deuk Jeon, Chungcheongbuk-do (KR)

(73) Assignee: Hynix Semiconductor Inc., Ich'on (KR)

(*) Notice: Subject to any disclaimer, the term of this patent is extended or adjusted under 35 U.S.C. 154(b) by 376 days.

(21) Appl. No.: 10/024,366

(22) Filed: Dec. 21, 2001

(65) Prior Publication Data

US 2003/0056053 A1 Mar. 20, 2003

(30) Foreign Application Priority Data

Sep. 20, 2001 (KR) .................................. 2001-58146

(51) Int. Cl.$^7$ ................................................. G06F 12/16
(52) U.S. Cl. ............................................................ 711/106
(58) Field of Search ............................... 711/105, 106; 365/222

(56) References Cited

U.S. PATENT DOCUMENTS

| | | | | |
|---|---|---|---|---|
| 6,341,097 B1 | * | 1/2002 | Hsu et al. | 365/222 |
| 6,515,928 B2 | * | 2/2003 | Sato et al. | 365/222 |
| 6,590,822 B2 | * | 7/2003 | Hwang et al. | 365/222 |
| 6,618,314 B1 | * | 9/2003 | Fiscus et al. | 365/227 |
| 6,650,587 B2 | * | 11/2003 | Derner et al. | 365/222 |
| 6,657,920 B2 | * | 12/2003 | Lee | 365/236 |

* cited by examiner

*Primary Examiner*—Kevin L. Ellis
(74) *Attorney, Agent, or Firm*—Jacobson Holman PLLC

(57) ABSTRACT

A low power semiconductor memory device having a normal mode and a partial array self refresh mode. The device includes a plurality of banks including a memory cell array; a memory control unit for generating a pre-bank selection signal related to the bank selection; a bank selection signal generating unit for generating a bank selection signal practically selecting a bank by using the pre-bank selection signal in the normal mode and for generating a bank selection signal according to refresh properties of the bank without using the pre-bank selection signal in the partial array self refresh mode.

16 Claims, 4 Drawing Sheets

LOW POWER SEMICONDUCTOR MEMORY DEVICE HAVING A NORMAL MODE AND A PARTIAL ARRAY SELF REFRESH MODE

BACKGROUND OF THE INVENTION

1. Field of the Invention

The present invention relates to a low power semiconductor memory device having a normal mode and a partial array self refresh mode and, more particularly, to a semiconductor memory device capable of remarkably reducing power consumption on stand-by by optimizing a refresh period in a partial array self refresh mode, by using a point that each bank has different refresh properties.

2. Description of the Related Art

Recently, there is a great demand for mobile systems such as cellular phones and personal digital assistants (PDA's). Therefore, it is required to develop a current-saving DRAM for these systems. A partial array self refresh mode has been proposed in order to meet these needs. The partial array self refresh mode is a method whereby when the amount of memory used is small and therefore, it is unnecessary to access all banks, only a predetermined bank is accessed in a system, thereby remarkably reducing the power consumption of chip. Here, the refresh is also performed only in the predetermined bank.

However, in a conventional system, a predetermined bank is generated in the partial array self refresh mode and provided to a bank unit. Therefore, the bank accessed in the partial array self refresh mode is identical in all memories having the same structures. However, although the structures are identical, bank refresh properties may be changed due to various reasons. Therefore, there are cases in which the bank, selected as default by the memory control unit, is not one having optimized refresh properties and it is impossible to employ the refresh properties of another bank. As a result, the conventional system has a disadvantage in that, when the predetermined bank has poor refresh properties, power consumption is increased due to short refresh period, thereby generating serious problems in the mobile system, using battery power and lowering stability of data maintenance.

SUMMARY OF THE INVENTION

Therefore, the present invention has been made to solve the above problems and an object of the present invention is to provide a semiconductor memory device capable of lowering power consumption in a partial array self refresh mode.

Another object of the present invention is to provide a semiconductor memory device capable of improving stability of data maintenance in a partial array self refresh mode.

In order to accomplish these objects, the bank selection signal generating unit of the present invention receives a pre-bank selection signal of a memory control unit to generate a bank selection signal for practically selecting a bank by using the pre-bank selection signal in a normal mode and to generate a bank selection signal for selecting a bank having optimized refresh properties in a partial array self refresh mode, without using the pre-bank selection signal.

The bank selection signal generating unit comprises a bank selection fuse circuit for outputting a signal indicating a bank to be selected in a partial array self refresh mode, and a bank selection circuit for passing the pre-bank selection signal to generate a bank selection signal in a normal mode and for inverting the pre-bank selection signal according to the output signal of the fuse circuit to generate a bank selection signal in a partial array self refresh mode.

The present invention further comprises a self refresh period signal generating unit for providing a self refresh period signal to a plurality of banks. The self refresh period signal generating unit provides a self refresh period signal, having a period most suitable for refresh properties of the bank selected by the bank selection signal in a partial array self refresh mode, to a predetermined bank selected in the partial array self refresh mode. The refresh period signal generating unit comprises a period signal generating circuit for generating a plurality of period signals having different periods; a period selection fuse circuit for outputting a signal indicating the self refresh period of a bank selected by the bank selection signal in the partial array self refresh mode; and a period signal selection circuit for selecting and outputting one period signal of a plurality of period signals in the period signal generating circuit by using the output signal of the period selection fuse circuit.

According to the present invention, it is possible to extend a refresh period by accessing a bank having optimized refresh properties in a partial array self refresh mode. Therefore, the present invention has the advantages of reducing the power consumption of the device and stabilizing data maintenance.

DETAILED DESCRIPTION OF THE INVENTION

The above objects, and other features and advantages of the present invention, will become more apparent after reading the following detailed description when taken in conjunction with the drawings.

Figure 1:
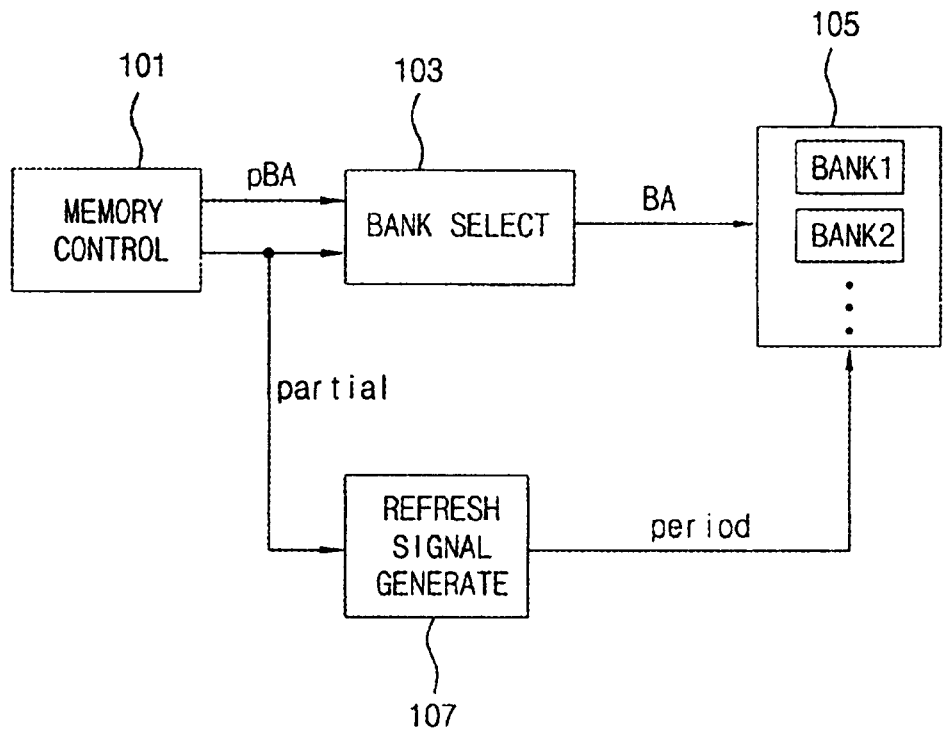
FIG. 1 is a block diagram of a low power semiconductor memory device according to the present invention.

FIG. 1 is a block diagram of a low power semiconductor memory device according to the present invention. Referring to FIG. 1, the present invention comprises a memory control unit 101, a bank selection signal generating unit 103, a bank unit 105 and a refresh period signal generating unit 107. The bank unit 105 comprises a plurality of banks including a memory cell array. In FIG. 1, "pBA" indicates a pre-bank selection signal, "partial" refers to a signal indicating a partial array self refresh mode, "BA" indicates a bank selection signal, and "period" refers to a self refresh period signal.

As shown in FIG. 1, the memory control unit 101 generates a pre-bank selection signal pBA which is provided to the bank selection signal generating unit 103, and generates a partial array self refresh mode signal which is provided to the bank selection signal generating unit 103 and refresh period signal generating unit 107. The bank selection signal generating unit 103 receives the pre-bank selection signal pBA and a partial array self refresh mode signal, partial, to generate a bank selection signal for practically selecting a bank and to provide to the bank unit 105. The bank selection signal generating unit 103 generates the bank selection signal BA by using the pre-bank selection signal pBA generated in the memory control unit 101 in a normal mode and inverts the pre-bank selection signal pBA in order to generate the bank selection signal BA selecting a bank having optimized refresh properties in a partial array self refresh mode. In the partial array self refresh mode, it is desirable that the bank selection signal generating unit 103 generates the bank selection signal BA selecting a bank having optimized refresh properties of a plurality of banks in the bank unit 105. The refresh period signal generating unit 107 generates the self refresh period signal, period, and provides such signal to the bank unit 105, wherein, in a partial array self refresh mode, such self refresh period signal is provided to a bank selected by bank selection signal BA having a desirable period in consideration of refresh properties of the bank.

According to a conventional method, there is no bank selection signal generating unit 103 and, therefore, the pre-bank selection signal pBA generated in the memory control unit 101 is directly provided to the bank unit 105. However, the present invention comprises the additional bank selection signal generating unit 103, thereby inverting a bank selected in a partial array self refresh mode. Therefore, although the pre-bank selection signal pBA, generated in the memory control unit 101 in a partial array self refresh mode, indicates a bank having poor refresh properties, the bank selection signal BA for practically selecting a bank, indicates a bank having optimized refresh properties. As a result, it is possible to employ a bank having improved refresh properties in a partial array self refresh mode.

Figure 2:
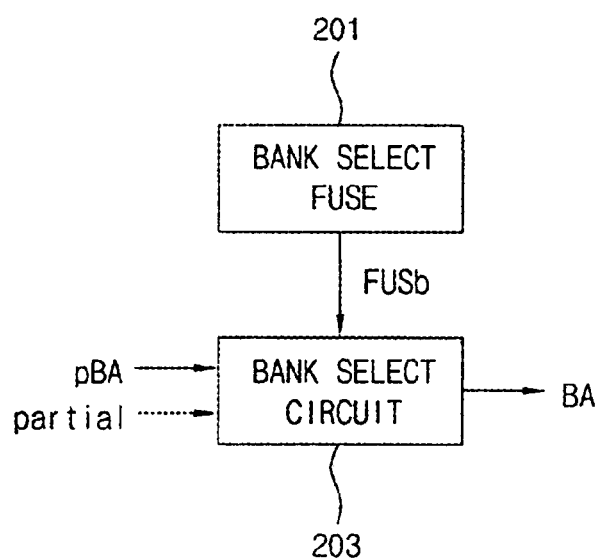
FIG. 2 is a block diagram of a bank selection signal generating unit according to the present invention.

FIG. 2 is a block diagram of a bank selection signal generating unit 103 according to the present invention. Referring to FIG. 2, the bank selection signal generating unit comprises a bank selection fuse circuit 201 and a bank selection circuit 203. In FIG. 2, "FUSb" is a signal for indicating a bank selected in a partial array self refresh mode. When the bank unit 105 comprises $2^n$ banks, the bank indication signal FUSb generally has n bits. However, it is not necessarily required to select a bank of all banks in the bank unit 105 in a partial array self refresh mode. Therefore, it is possible to have fewer bits than n−1. The pre-bank selection signal pBA, the partial array self refresh mode signal, partial, and the bank selection signal BA are the same as that in FIG. 1.

Figure 3:
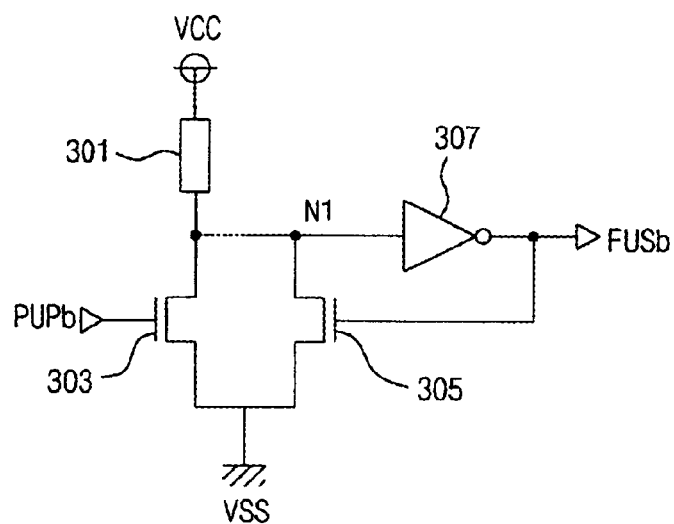
FIG. 3 is a circuit diagram of a fuse circuit according to the present invention.

The bank selection fuse circuit 201 outputs a signal FUSb indicating a bank to be selected in the bank selection partial array self refresh mode. FIG. 3 is a circuit diagram of the bank selection fuse circuit 201 when the bank selection signal is 1 bit. As described above, when the bank unit 105 comprises $2^n$ banks, one semiconductor memory device generally includes n circuits shown in FIG. 3. As shown in FIG. 3, the bank selection fuse circuit 201 comprises a fuse 301, two NMOS transistors 303, 305 and an inverter 307. In FIG. 3, VCC indicates source terminal and VSS ground terminal. A PUPb is a pulse type signal enabled to high level once in early power up and immediately disabled.

As shown in FIG. 3, the fuse 301 is connected to VCC at one end and the other end is connected to the output terminal through the inverter 307, wherein the output terminal is latched. A wafer test is performed in order to check refresh properties of each bank. Then, fuse cutting is performed in order to access a bank having optimized refresh properties in a partial array self refresh mode.

In FIG. 3, if the fuse 301 is cut, when the input signal PUPb is on high level, node N1 becomes low level and the output FUSb becomes high level and latched. Therefore, when the fuse 301 is cut, the output FUSb is always high level. However, if the fuse 301 is not cut, the node N1 is always high level after power up and the output FUSb maintains low level. Therefore, the output FUSb is controlled to 1 or 0 according to whether or not the fuse 301 is cut after manufacturing the device.

Figure 4:
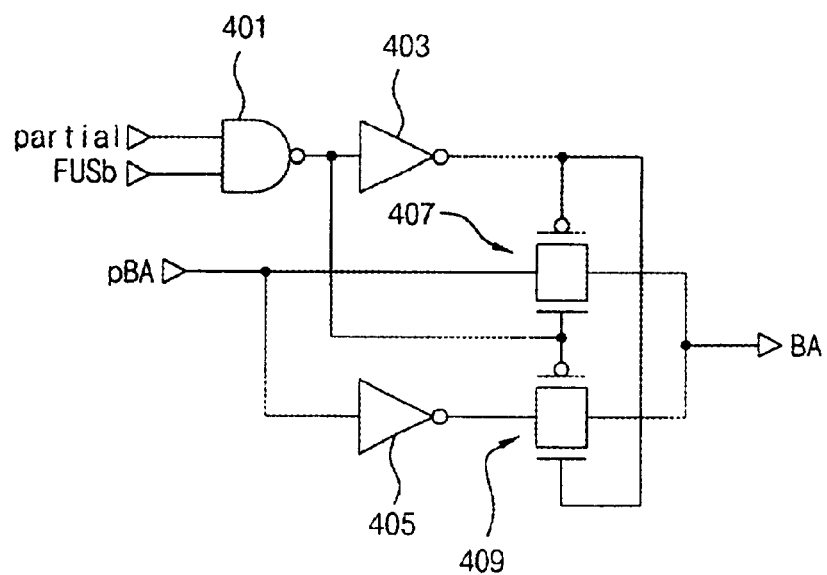
FIG. 4 is a circuit diagram of a bank selection circuit according to the present invention.

The bank selection circuit 203 passes the pre-bank selection signal pBA to generate a bank selection signal BA in a normal mode and inverts the pre-bank selection signal pBA according to the output signal of the bank selection fuse circuit 201 to generate a bank selection signal BA in a partial array self refresh mode. FIG. 4 is a circuit diagram of a bank selection circuit corresponding to 1 bit, wherein when the bank unit 105 comprises $2^n$ banks, one semiconductor memory device includes n identical circuits. As shown in FIG. 4, the bank selection circuit includes NAND gate 401, inverters 403 and 405, and transmission gates 407 and 409. The signal, partial, indicates a partial array self refresh mode, becoming high level in a partial array self refresh mode. The FUSb is an output signal of the circuit shown in FIG. 3, pBA is, a pre-bank selection signal generated in the memory control unit 101, and BA is a bank selection signal.

The operation of the bank selection circuit will be described with reference to FIG. 4. Referring to FIG. 4, in a normal mode, the partial array self refresh mode signal, partial, is on low level. Therefore, the pre-bank selection signal pBA is directly transmitted to the bank selection signal BA, thereby controlling a bank to be controlled. However, in a partial array self refresh mode, the mode signal, partial, becomes high level and it is determined whether the pre-bank selection signal pBA is directly transmitted to the bank selection signal BA or inverted, according to the level of bank indication signal FUSb. Therefore, when n circuits, having the structure shown in FIG. 4, are employed, it is possible to select a bank having optimized refresh properties of $2^n$ banks.

Figure 5:
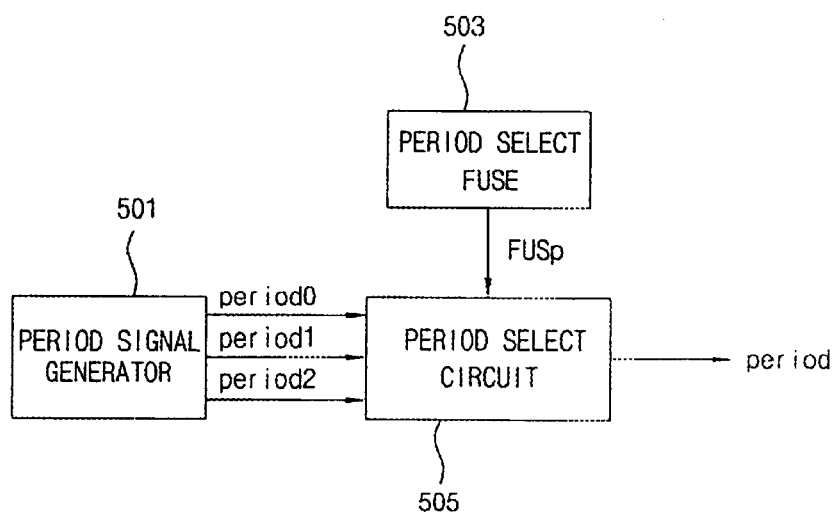
FIG. 5 is a block diagram of a refresh period signal generating unit according to the present invention.

FIG. 5 is a block diagram of a refresh period signal generating unit according to the present invention. Referring to FIG. 5, the refresh period signal generating unit comprises a period signal generating unit 501, a period selection fuse circuit 503, and a period signal selection circuit 505. In FIG. 5, "period0" indicates a fundamental period signal, "period1" refers to a first period signal and "period2" indicates a second period signal. The FUSp is a signal for indicating a period signal selected in a partial array self refresh mode and period is a period signal selected and outputted by the period signal selection circuit 505.

The period signal generating circuit 501 generates a plurality of period signals period0, period1, period 2 having different periods to provide to the period signal selection circuit 505. The period selection fuse circuit 503 outputs a signal FUSp for indicating a self refresh period of a bank selected by bank selection signal in a partial array self refresh mode. The period signal selection circuit 505 selects and outputs one period signal of a plurality of period signals period0, period1, period2 in the period signal generating circuit 501 by using the output signal FUSp of the period selection fuse circuit 503. In FIG. 5, the period signal generating circuit 501 generates three period signals. However, when the period indication signal FUSp is m bit, the period signal provided by the period signal generating circuit 501 is less than $2^m$.

Figure 6:
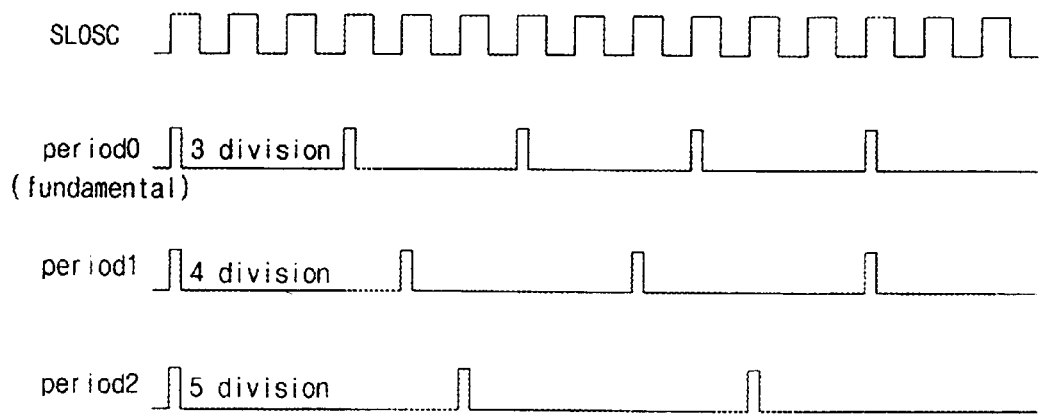
FIG. 6 is a waveform diagram of a plurality of period signals generated in the period signal generating circuit, having different periods.

FIG. 6 is a waveform diagram of a plurality of period signals generated in the period signal generating circuit 501. In FIG. 6, SLOSC is an input signal having several μs period, generated in the device and a fundamental period signal, period0 by 3 division of the SLOSC, is employed in a normal mode. When the fundamental period signal, period0, is employed for self refresh, the self refresh is performed every 3 division. The self refresh is changeable according to the period of SLOSC. FIG. 6 shows a first period signal, period1, having 4 division and a second period signal, period2, having 5 division. The first period signal, period1, and the second period signal, period2, are signals to extend the self refresh period. For example, although a bank having optimized refresh properties is selected in a partial array self refresh mode, if data are damaged when a self refresh is performed by the second period signal, period2, and if data are maintained when a self refresh is performed by the fundamental period signal, period0, and the first period signal, period1, a self refresh is performed to the bank by the first period signal, period1, in a partial array self refresh mode.

The period selection fuse circuit 503 has the same structure as the bank selection fuse circuit shown in FIG. 3 and a period signal, employed in partial array self refresh mode, is indicated by fuse cutting. According to this embodiment, the output signal FUSp of the period selection fuse circuit 503 has two bits.

Figure 7:
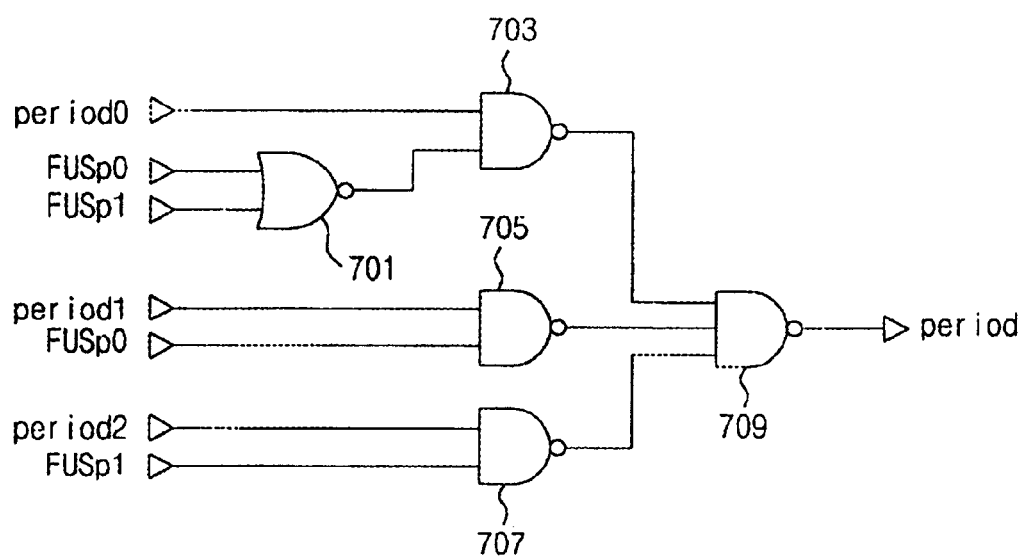
FIG. 7 is a circuit diagram of a period signal selection circuit according to the present invention.

The period signal selection circuit 505 selects and outputs one period signal of a plurality of period signals in the period signal generating circuit 501 by using the output signal of the period selection fuse circuit 503. FIG. 7 is a circuit diagram of the period signal selection circuit according to the present invention. Referring to FIG. 7, the period signal selection circuit of the present invention comprises a NOR gate 701 and NAND gates 703, 705, 707, 709. In FIG. 7, "period0" indicates a fundamental period signal having 3 division, "period1" refers to a first period signal having 4 division, "period2" indicates a second period signal having 5 division, and "period" is an output signal of the period signal selection circuit. Signal FUSp0 indicates a first period indication fuse signal and FUSp1 refers to a second period indication fuse signal.

When both the first period indication fuse signal FUSp0 and the second period indication fuse signal FUSp1 are on low level, the fundamental period signal, period0, having 3 division becomes an output and, when only first period indication fuse signal FUSp0 is on high level, the first period signal, period1, having 4 division becomes an output. When only second period indication fuse signal FUSp1 is on high level, the second period signal, period2, becomes an output. The selection of period signal is performed by fuse cutting according to the bank having optimized refresh properties.

As described above, according to the present invention, it is possible to extend the period by accessing a bank having optimized refresh properties in a partial array self refresh mode, thereby reducing the power consumption of the device. It is also possible to stabilize data maintenance by accessing a bank having optimized refresh properties in a partial array self refresh mode.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A low power semiconductor memory device having a normal mode and a partial array self refresh mode, comprising:
   a plurality of banks comprising a memory cell array;
   a memory control unit for generating a pre-bank selection signal related to bank selection;
   a bank selection signal generating unit for generating a bank selection signal which selects a bank by using the pre-bank selection signal in the normal mode and for generating a bank selection signal according to refresh properties of the banks without using the pre-bank selection signal in the partial array self refresh mode.

2. The low power semiconductor memory device according to claim 1, wherein the bank selection signal generating unit generates a bank selection signal for selecting a bank having optimized refresh properties of a plurality of banks in the partial array self refresh mode.

3. The low power semiconductor memory device according to claim 1, wherein the bank selection signal generating unit comprises:
   a bank selection fuse circuit for outputting an output signal indicating a bank to be selected in the partial array self refresh mode; and
   a bank selection circuit for passing the pre-bank selection signal to generate a bank selection signal in the normal mode and for generating a bank selection signal according to the output signal of the bank selection fuse circuit in the partial array self refresh mode.

4. The low power semiconductor memory device according to claim 1, further comprising a refresh period signal generating unit for providing a self refresh period signal to the selected bank.

5. The low power semiconductor memory device according to claim 4, wherein the refresh period signal generating unit provides a self refresh period signal, having a period according to refresh properties of the bank selected by the bank selection signal in the partial array self refresh mode, to the selected bank.

6. The low power semiconductor memory device according to claim 4, wherein the refresh period signal generating unit comprises:
   a period signal generating circuit for generating a plurality of period signals having different periods;
   a period selection fuse circuit for outputting a signal indicating a self refresh period of the bank selected by the bank selection signal in the partial array self refresh mode; and
   a period signal selection circuit for selecting and outputting one period signal of a plurality of period signals from the period signal generating circuit by using the output signal of the period selection fuse circuit.

7. A low power semiconductor memory device having a normal mode and a partial array self refresh mode, comprising:
   a plurality of banks comprising a memory cell array;
   a memory controller for generating a pre-bank selection signal related to bank selection;
   a bank selection fuse circuit for outputting an output signal indicating a bank to be selected in the partial array self refresh mode;
   a bank selection circuit for passing the pre-bank selection signal to generate a bank selection signal in the normal mode and for generating a bank selection signal according to the output signal of the bank selection fuse circuit in the partial array self refresh mode; and a refresh period signal generating circuit for providing a self refresh period signal to the selected bank.

8. The low power semiconductor memory device according to claim 7, wherein the bank selection circuit generates a bank selection signal selecting a bank having optimized refresh properties of a plurality of banks in the partial array self refresh mode.

9. The low power semiconductor memory device according to claim 7, wherein the refresh period signal generating circuit provides a self refresh period signal having a period according to refresh properties of the bank selected by the bank selection signal, to the selected bank in the partial array self refresh mode.

10. The low power semiconductor memory device according to claim 7, wherein the refresh period signal generating unit comprises:

a period signal generating circuit for generating a plurality of period signals having different periods;

a period selection fuse circuit for outputting signal indicating a self refresh period of the bank selected by the bank selection signal in the partial array self refresh mode; and a period signal selection circuit for selecting and outputting one period signal of a plurality of period signals from the period signal generating circuit by using the output signal of the period selection fuse circuit.

11. A method of controlling a partial array self refresh mode in a low power semiconductor memory device having a plurality of banks comprising steps of:

generating a pre-bank selection signal related to bank selection; and generating a bank selection signal for selecting a bank by using the pre-bank selection signal in a normal mode and generating a bank selection signal according to refresh properties of said plurality of banks without using the pre-bank selection signal in the partial array self refresh mode.

12. The method of controlling a partial array self refresh mode according to claim 11, wherein the step of generating a bank selection signal is performed by generating a bank selection signal for selecting a bank having optimized refresh properties in the partial array self refresh mode.

13. The method of controlling a partial array self refresh mode according to claim 11, wherein the step of generating the bank selection signal comprises steps of:

outputting a signal indicating a bank to be selected in the partial array self refresh mode; and generating a bank selection signal by passing the pre-bank selection signal in the normal mode and generating a bank selection signal according to the bank indicating signal in the partial array self refresh mode.

14. The method of controlling a partial array self refresh mode according to claim 11, further comprising a step of providing a self refresh period signal to the selected bank.

15. The method of controlling a partial array self refresh mode according to claim 14, where in the step of providing a self refresh period signal is performed by providing to the selected bank a self refresh period signal having a period according to refresh properties of a bank selected by the bank selection signal in the partial array self refresh mode.

16. The method of controlling a partial array self refresh mode according to claim 14, wherein the step of providing the self refresh period signal comprises steps of:

generating a plurality of period signals having different periods;

outputting a signal indicating a self refresh period of a bank selected by the bank selection signal in the partial array self refresh mode; and selecting one period signal of the plurality of period signals by using the self refresh period indicating signal.

* * * * *